United States Patent
Ge et al.

(10) Patent No.: US 11,499,236 B2
(45) Date of Patent: Nov. 15, 2022

(54) ETCHING SOLUTION FOR TUNGSTEN WORD LINE RECESS

(71) Applicant: Versum Materials US, LLC, Tempe, AZ (US)

(72) Inventors: Jhih Kuei Ge, Chupei (TW); Yi-Chia Lee, Chupei (TW); Wen Dar Liu, Chupei (TW)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 16/297,957

(22) Filed: Mar. 11, 2019

(65) Prior Publication Data

US 2019/0284704 A1 Sep. 19, 2019

Related U.S. Application Data

(60) Provisional application No. 62/655,856, filed on Apr. 11, 2018, provisional application No. 62/644,131, filed on Mar. 16, 2018.

(51) Int. Cl.
*C23F 1/26* (2006.01)
*H01L 21/3213* (2006.01)
*H01L 21/311* (2006.01)
*H01L 21/02* (2006.01)

(52) U.S. Cl.
CPC .......... *C23F 1/26* (2013.01); *H01L 21/32134* (2013.01); *H01L 21/02063* (2013.01); *H01L 21/31111* (2013.01)

(58) Field of Classification Search
CPC .............. C23F 1/26; H01L 21/32134; H01L 21/02063; H01L 21/31111; C09K 13/06; C09K 13/08
See application file for complete search history.

(56) References Cited

U.S. PATENT DOCUMENTS

| | | | |
|---|---|---|---|
| 6,306,775 B1 | 10/2001 | Li | |
| 9,222,018 B1 | 12/2015 | Casteel, Jr. et al. | |
| 9,976,111 B2 * | 5/2018 | Liu | C11D 3/3947 |
| 2004/0224866 A1 | 11/2004 | Matsunaga et al. | |
| 2007/0009449 A1 * | 1/2007 | Kanca, III | A61K 6/40 424/49 |
| 2009/0120457 A1 * | 5/2009 | Naghshineh | C11D 3/3947 134/2 |
| 2010/0105595 A1 * | 4/2010 | Lee | C11D 7/3272 510/176 |
| 2011/0281436 A1 * | 11/2011 | Inaba | C11D 7/3209 438/710 |
| 2013/0045908 A1 | 2/2013 | Cui | |
| 2014/0097006 A1 * | 4/2014 | Park | H01L 29/4908 174/257 |
| 2015/0200112 A1 * | 7/2015 | Han | C23F 1/26 438/478 |
| 2015/0243527 A1 * | 8/2015 | Muro | C09K 13/08 438/754 |
| 2016/0083650 A1 | 3/2016 | Sugishima et al. | |
| 2016/0186105 A1 * | 6/2016 | Liu | C11D 11/0047 510/175 |
| 2016/0200975 A1 * | 7/2016 | Cooper | H01L 21/32134 216/13 |
| 2016/0240368 A1 * | 8/2016 | Cui | C23F 1/38 |
| 2016/0340581 A1 | 11/2016 | Gu | |
| 2017/0260449 A1 * | 9/2017 | Barnes | C09K 13/06 |
| 2019/0301026 A1 | 3/2019 | Kouno et al. | |

FOREIGN PATENT DOCUMENTS

| | | |
|---|---|---|
| CN | 107731735 | 2/2018 |
| EP | 1975987 A2 | 1/2008 |
| EP | 3076424 A1 | 10/2016 |
| JP | 2004315887 A | 11/2004 |
| JP | 2009021516 A | 1/2009 |
| JP | 2010524208 A | 7/2010 |
| JP | 2015506583 A | 3/2015 |
| JP | 2016536785 A | 11/2016 |
| JP | 2017502491 A | 1/2017 |
| JP | 2018006715 A | 11/2018 |
| KR | 20130049503 A | 5/2013 |
| KR | 20130049507 A | 5/2013 |
| KR | 20150050278 A | 12/2013 |
| KR | 20150050278 A | 5/2015 |
| KR | 20170112314 | 10/2017 |
| WO | 2013101907 A1 | 7/2013 |
| WO | 2015017659 A1 | 2/2015 |
| WO | 2017165637 A1 | 9/2017 |
| WO | 2018008745 A1 | 1/2018 |

\* cited by examiner

*Primary Examiner* — Allan W. Olsen
(74) *Attorney, Agent, or Firm* — William T. Slaven, IV

(57) ABSTRACT

Described herein is an etching solution suitable for both tungsten-containing metals and TiN-containing materials, which comprises: water; and one or more than one oxidizers; and one or more than one of the components selected from the group consisting of: one or more fluorine-containing-etching compounds, one or more organic solvents, one or more chelating agents, one or more corrosion inhibitors and one or more surfactants.

23 Claims, No Drawings

ETCHING SOLUTION FOR TUNGSTEN WORD LINE RECESS

CROSS-REFERENCE TO RELATED APPLICATIONS

This application claims priority under 35 U.S.C. § 119(e) to U.S. provisional patent application No. 62/644,131, filed on Mar. 16, 2018, and U.S. provisional patent application No. 62/655,856, filed on Apr. 11, 2018, the entirety of which is incorporated herein by reference.

BACKGROUND OF THE INVENTION

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

Fabrication of semiconductor memory devices involves deposition and etching of multiple layers of materials in order to form a desired pattern of conductive paths in a layer of dielectric. Anisotropic etching (i.e. predominant etching in a selected direction) is a valuable tool for forming recessed features on semiconductor substrates. In a typical example of anisotropic etching, the material is etched out in a vertical direction, without horizontal etching. For example, the material can be removed from the bottom of a recessed feature, while preserving the width of the recessed feature.

Tungsten and tungsten-containing materials emerge as materials that find many uses in IC fabrication, both as conductive layers, and more recently as hardmasks in dynamic random-access memory (DRAM) and 3D NAND fabrication. While there is a variety of methods that can be used for tungsten deposition, including chemical vapor deposition (CVD), atomic layer deposition (ALD), and physical vapor deposition (PVD), the methods for tungsten etching are still limited. The etching of tungsten-containing material sometimes needs to be performed selectively to other exposed materials, such as silicon oxide, silicon nitride, silicon oxynitride, and combinations thereof.

A conventional vertical NAND string uses an aluminum oxide (Al oxide) etch-stop layer for stopping a high-aspect-ratio pillar (trench) etch. Because the Al oxide etch-stop layer does not have sufficient etch selectivity, a relatively thicker layer of the Al oxide is needed in order to be able to control stopping of the etch. The relatively thicker Al oxide layer causes an undesirably longer channel distance between the select gate (SG) and the first wordline (WL) of the NAND string, thereby underutilizing the full length of the NAND string channel.

During fabrication of the 3D NAND memory device, tungsten (W) recess for word-line (WL) isolation is one of the key process steps. Typically, high-k/metal gate are used for the connection of tungsten control gate. In the recessing process TiN and W should be simultaneously etched with equal thickness. See FIG. 1. AlOx is the protecting layer that should not be damaged. As the number of layers increases, it is difficult to completely etch the bottom layer of W and TiN by dry etch-methods because the dry-etching by product from the top layer would remain in the trenches and restrict etching the bottom layer. Therefore wet-etch method is proposed as an alternative for W recess.

Conventional wet-etch methods have technical challenges. Typical wet-etch chemicals would easily etch the AlOx and cause a recess in the side wall of the channel at the AlOx layer that forms an undesirable floating gate and results in an on-current degradation for the NAND string. Additionally, conventional wet etchants show low TiN or W etch rates that result in the extremely long process time (over 1 hr). The long process time means the wet etchant needs to be applied in a batch type tool and makes impractical the use of a single wafer tool (SWT) for that step.

Described herein is an etching solution for tungsten-containing and titanium nitride-containing materials. More particularly, described herein is an etching solution with selective etching properties for tungsten-containing and titanium nitride-containing materials with respect to other metals and/or materials during the manufacture of a microelectronic device.

BRIEF SUMMARY OF THE INVENTION

Described herein is an etching solution suitable for both tungsten(W)-containing metals and titanium nitride(TiN)-containing materials, which comprises, consists essentially of, or consists of: water, one or more oxidizers; and one or more of the components selected from the group consisting of: one or more fluorine-containing-etching compounds, one or more organic solvents, one or more chelating agents, one or more corrosion inhibitors, and one or more surfactants. In some embodiments, the etching solution suitable for both tungsten(W)-containing metals and titanium nitride(TiN)-containing materials, comprises, consists essentially of, or consists of: water, one or more oxidizers; and two or more components selected from the group consisting of: one or more fluorine-containing-etching compounds, one or more organic solvents, one or more chelating agents, one or more corrosion inhibitors, and one or more surfactants. In some embodiments, the etching solution suitable for both tungsten (W)-containing metals and titanium nitride(TiN)-containing materials, comprises, consists essentially of, or consists of: water, one or more oxidizers; one or more fluorine-containing-etching compounds; and optionally one or more of the following: one or more corrosion inhibitors, one or more organic solvents, one or more chelating agents, and one or more surfactants. In some embodiments, the etching solution suitable for both tungsten(W)-containing metals and titanium nitride(TiN)-containing materials, comprises, consists essentially of, or consists of: water, one or more oxidizers; one or more fluorine-containing-etching compounds; one or more corrosion inhibitors and optionally one or more of the following: one or more organic solvents, one or more chelating agents, and one or more surfactants. In some embodiments, the etching solution suitable for both tungsten (W)-containing metals and titanium nitride(TiN)-containing materials, comprises, consists essentially of, or consists of: water, one or more oxidizers; one or more fluorine-containing-etching compounds; one or more corrosion inhibitors; and one or more solvents; and optionally one or more chelating agents and optionally one or more surfactants. In some embodiments, the etching solution suitable for both tungsten(W)-containing metals and titanium nitride(TiN)-containing materials, comprises, consists essentially of, or consists of: water, one or more oxidizers; one or more organic solvents; one or more surfactants; and optionally one or more of the following: one or more fluorine-containing-etching compounds; one or more corrosion inhibitors, and one or more chelating agents. Any of the etching solutions may further comprise two or more oxidizers. Any of the etching solutions may further comprise one or more ammonium salts of organic acids. In some embodiments, the etching solutions may further comprise two or more corrosion inhibitors. The composition may have a pH less than 7 or less than 5 or less than 3. Controlling the pH of the composition improves the TiN and/or W and/or AlOx selectivity.

In some embodiments, the wet etchant provides desired TiN and W etch rates which may mean TiN:W selectivity within the range of 1:10 to 10:1, or 1:8 to 8:1, or 1:5 to 5:1, or 1:3 to 3:1, or 1:2 to 2:1, or 1.5:1 to 1.5:1. It was determined that etch rates on test wafers within those ratios provided good results for many patterned wafers (microelectronic devices). In one embodiment, the wet etchant provides about equal TiN and W etch rates which means the TiN:W selectivity is close to 1. In some embodiments, metal oxides, for example, aluminum oxide-containing materials, such as, aluminum oxide (AlOx), are used as the protecting layer of transistors and barrier layer of plugs, so the etchant composition may additionally be compatible with certain metal oxides, such as, AlOx-containing materials. Conventional wet-etchant provides low TiN and W etch rates, requiring long processing times. In some embodiments, the etchant compositions of this invention provide faster removal rates (higher removal rates) and thereby shorter processing times. Faster processing speeds makes using a single wafer tool possible, as compared to longer processing speeds, which may call for the use of a batch tool instead. However, in other embodiments a batch tool is used and slower removal rates are provided In some embodiments, the W and/or TiN etch rate can be adjusted, by modifying the etchant formulation or the processing conditions or both. For examples, the etchant compositions of this invention can provide W and/or TiN removal rates in the range from about 10 Å/min to about 400 Å/min or greater, or from about 15 Å/min to about 400 Å/min or greater, or 50 Å/min to about 75 Å/min or greater, or from about 150 Å/min to about 200 Å/min or greater, or from about 300 Å/min to about 400 Å/min or greater, or from about 2 to about 20 Å/min. Additionally, the TiN to W selectivity may be close to 1, that is 1±80%, or 1±50%, 1±25%, or 1±10%. With such high TiN and W etch rates, (again) the wet-etch chemistries of this invention make it possible to operate on a single wafer tool or a batch tool.

For some etchant formulations of this invention, the W etch rate is preferably greater than the TiN etch rate. For other etchant formulations of this invention, the TiN etch rate is greater than the W etch rate.

Additionally, in some embodiments the etchants of this invention are compatible with AlOx-containing material, that is, they provide a low AlOx etch rate, such as, less than 50 Å/min, or less than 40 Å/min, or less than 30 Å/min, or less than 20 Å/min, or less than 15 Å/min, or less than 10 Å/min, or less than 7 Å/min, or less than 5 Å/min, or less than 3 Å/min, or less than 1 Å/min. In some embodiments the etch rate of the W-containing metal and/or the TiN containing material are at least 10 times, or at least 15 times, or at least 20 times greater than the etch rate of the AlOx.

Furthermore, the wet-etch chemistries are compatible with most of the construction materials used on single wafer (SWT) and batch tool. As stated earlier, they can be applied on SWT or batch tool for the W word-line recess process step.

DETAILED DESCRIPTION OF THE INVENTION

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by the context. The terms "comprising," "having," "including," and "containing" are to be construed as open-ended terms (i.e., meaning "including, but not limited to,") unless otherwise noted, but also include the partially closed or closed terms of "consisting essentially of" and "consisting of". Recitation of ranges of values herein are merely intended to serve as a shorthand method of referring individually to each separate value falling within the range, unless otherwise indicated herein, and each separate value is incorporated into the specification as if it were individually recited herein, and any value reported herein can be used, in any combination, as the beginning or end of a range for the aspect for which it is described. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention. All percentages are weight percentages and all weight percentages are based on the total weight of the composition (prior to any optional concentration and/or dilution thereof). Every use of "one or more" means and can be substituted with "one or more than one" everywhere it appears. Additionally, "one or more" can be substituted with "two or more than two" or "three or more than three" or "four or more than four" and so on.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The present invention relates generally to compositions and methods useful for the selective removal of TiN-containing materials and/or tungsten-containing metals and/or aluminum oxide-containing materials from a microelectronic device having such material(s) thereon. In one embodiment, the invention relates generally to compositions useful for the removal of TiN-containing materials and/or tungsten-containing metals with substantially less removal to no removal of the aluminum oxide-containing materials from a microelectronic device having such material(s)

thereon. In another embodiment, the invention relates generally to compositions useful for the removal of TiN-containing materials and tungsten-containing metals and the little or no removal aluminum oxide-containing materials from a microelectronic device having such material(s) thereon. In another embodiment, the removal rate of TiN-containing materials is within ±500, or within ±450%, or within ±400%, or within ±300, or within ±200%, or within ±100%, or within ±50%, or within ±20%, or within ±10%, or within ±5%, or within ±3%, or within ±1%, of the removal rate of the tungsten-containing metals. Preferably and stated differently the ratio of the removal rate of TiN-containing materials divided by the removal rate of the tungsten-containing metals is about 1. In some embodiments the removal of the TiN-containing materials and/or the W-containing materials are greater than 10 times, or greater than 20 times, or greater than 40 times, or greater than 60 times, or greater than times 80 times or greater than 100 times, or greater than 120, or greater than 140 times, or greater than 160 times, or greater than times 180 times, or greater than 200 times, or greater than 220 times, or greater than 240 times, or greater than 260 times, or greater than 280 times, or greater than 300 times, the removal rate of the AlOx-containing materials. Note any mention of titanium nitride (TiN), tungsten (W), and aluminum oxide (AlOx) includes TiN-containing materials and W-containing materials and AlOx-containing materials respectively.

For ease of reference, "microelectronic device" corresponds to semiconductor substrates, flat panel displays, phase change memory devices, NAND memory devices, solar panels and other products including solar substrates, photovoltaics, and microelectromechanical systems (MEMS), manufactured for use in microelectronic, integrated circuit, or computer chip applications. Solar substrates include, but are not limited to, silicon, amorphous silicon, polycrystalline silicon, monocrystalline silicon, CdTe, copper indium selenide, copper indium sulfide, and gallium arsenide on gallium. The solar substrates may be doped or undoped. It is to be understood that the term "microelectronic device" is not meant to be limiting in any way and includes any substrate that will eventually become a microelectronic device or microelectronic assembly.

As defined herein, the term "barrier material" corresponds to any material used in the art to seal the metal lines, e.g., copper interconnects, to minimize the diffusion of said metal, e.g., copper, into the dielectric material. Preferred barrier layer materials include tantalum, titanium, ruthenium, hafnium, and other refractory metals and their nitrides and silicides.

The term "tungsten-containing metal" means tungsten metal (W) or an alloy comprising tungsten as the main component (at least 70 mass %). Specific examples of tungsten alloys include molybdenum-tungsten (MoW) and tungsten silicide (WSi). The term "TiN-containing material" means a layer, the majority of which is TiN. The term "AlOx-containing material" means a layer, the majority of which is AlOx.

"Substantially free" is defined herein as less than 0.000001 wt %, or less than 1 parts per million (ppm). "Substantially free" also includes 0.0000000 wt. % and 0 ppm. The term "free of" means less than 0.0000000 wt. % or less than 0 ppm.

As used herein, "about" is intended to correspond to ±5% of the stated value.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.000001 weight percent, based on the total weight of the composition in which such components are employed.

In the broad practice of this aspect, the etching solution suitable for both tungsten-containing metals and TiN-containing according to the present invention comprises, consists essentially of, or consists of, in effective etching amounts: water; one or more than one oxidizers; and one or more of the components selected from the group consisting of: one or more fluorine-containing-etching compounds, one or more organic solvents, one or more chelating agents, one or more corrosion inhibitors, one or more surfactants.

Water

The etching solution compositions of the present invention are aqueous-based and, thus, comprise water. In the present invention, water functions in various ways such as, for example, to dissolve one or more solid components of the composition, as a carrier of the components, as an aid in the removal of metallic residue, as a viscosity modifier of the composition, and as a diluent. Preferably, the water employed in the cleaning composition is de-ionized (DI) water (DIW).

It is believed that, for most applications, the compositions of this invention will comprise a total amount of water (from all sources, that is, from any DIW added directly to the composition and, if any, from aqueous solutions of the components added to the composition) will comprise, for example, from about 5% to about 95% by wt., or 1% to about 90% by wt., or about 10% to about 80% by wt., or about 1% to about 45% by wt., or about 5% to about 40% by wt., or about 2% to about 35% by wt., or about 1% to about 30% by wt., or about 40% to about 95% by wt., or about 30% to about 80% by wt., or about 50% to about 90% by wt., or about 25% to about 70% by wt., or about 20% to about 60% by wt., or about 40% to about 70% by wt., or about 40% to about 99% by wt. of water. Other preferred embodiments of the present invention could comprise from about 50% to about 80% by wt., or about 50% to about 90% by wt., or about 5% to about 35% by wt. or about 10% to about 30% by wt., or about 20% to about 30% by wt., or about 70% to about 99% by wt. of water. Still other preferred embodiments of the present invention could include water in an amount to achieve the desired weight percent of the other ingredients. The water may be present in a weight percent within any range defined by any of the following endpoints: 1, 2, 5, 10, 20, 25, 30, 35, 40, 45, 50, 60, 65, 70, 80, 90, 95, 99.

Oxidizer

Oxidizers are included in the etchant composition of this invention to oxidize TiN to TiNOx, and/or oxidize W to WOx. The composition may comprise one or more oxidizers. Oxidizers contemplated herein include, but are not limited to, hydrogen peroxide ($H_2O_2$), $FeCl_3$, $FeF_3$, $Sr(NO_3)_2$, $CoF_3$, $MnF_3$, OXONE® monopersulfate compound (2 $KHSO_5$, $KHSO_4$, $K_2SO_4$) (OXONE is a registered trademark of E.I. du Pont de Nemours and Company), periodic acid, iodic acid, vanadium (V) oxide, vanadium (IV,V) oxide, ammonium vanadate, ammonium polyatomic salts (e.g., ammonium peroxomonosulfate, ammonium chlorite ($NH_4ClO_2$), ammonium chlorate ($NH_4ClO_3$), ammonium iodate (NH4IO3), ammonium nitrate (NH4NO3), ammonium perborate (NH4BO3), ammonium perchlorate (NH4ClO4), ammonium periodate (NH4IO4), ammonium persulfate ((NH4)2S2O8), ammonium hypochlorite (NH4ClO)), ammonium tungstate ((NH4)10H2(W2O7)), sodium polyatomic salts (e.g., sodium persulfate (Na2S2O8), sodium hypochlorite (NaClO), sodium perborate), potassium polyatomic salts (e.g., potassium iodate (KIO3), potassium permanganate (KMnO4), potassium persulfate, nitric acid (HNO3), potassium persulfate (K2S2O8), potassium hypochlorite (KClO)), tetramethylammonium polyatomic salts (e.g., tetramethylammonium chlorite ((N(CH3)4)ClO2), tetramethylammonium chlorate ((N(CH3)4)ClO3), tetramethylammonium iodate ((N(CH3)4)IO3), tetramethylammonium perborate ((N(CH3)4)BO3), tetramethylammonium perchlorate ((N(CH3)4)ClO4), tetramethylammonium periodate ((N(CH3)4)IO4), tetramethylammonium persulfate ((N(CH3)4)S2O8)), tetrabutylammonium polyatomic salts (e.g., tetrabutylammonium peroxomonosulfate), peroxomonosulfuric acid, ferric nitrate (Fe(NO3)3), urea hydrogen peroxide ((CO(NH2)2)H2O2), phosphoric acid (H3PO4), peracetic acid (CH3(CO)OOH), 1,4-benzoquinone, toluquinone, dimethyl-1,4-benzoquinone, chloranil, alloxan, N-methylmorpholine N-oxide, trimethylamine N-oxide, and combinations thereof. When the oxidizer is a salt it can be hydrated or anhydrous. The oxidizer may be introduced to the composition at the manufacturer, prior to introduction of the composition to the microelectronic device (wafer), or alternatively at the microelectronic device (wafer), i.e., in situ. In some embodiments, the one or more oxidizers for the composition of this invention may comprise hydrogen peroxide, nitric acid or phosphoric acid or mixtures of two or more thereof.

It is believed that the total amount of the one or more oxidizers in the etching composition of the present invention will be from about 0.5% to about 60%, or from about 0.5% to about 50%, or from about 1.0% to about 35%, or from about 3.0% to about 30% by weight of the composition. The compositions of this invention may comprise from about 5% to about 15% by weight H2O2, that may be present alone or in combination with a second oxidizer in the etchant composition. The second oxidizer may be phosphoric acid and it may comprise from about 0.1% to 20% by weight of the composition. In some embodiments nitric acid is preferred. In other embodiments the one or more oxidizers comprise phosphoric acid and nitric acid. In some embodiments the phosphoric acid is present in the composition in an amount that is greater than the amount of nitric acid. In some embodiments the phosphoric acid is present in the composition in an amount that is less than the amount of nitric acid. In some embodiments the amount of the phosphoric acid is within ±15% of the amount of nitric acid. In other embodiments, the amount of nitric acid is greater than 10 times, or greater than 20 times, or greater than 25 times, or greater than 30 times the amount of the phosphoric acid. In some embodiments, the one or more oxidizers comprise from about 2% to about 45% by weight, or from about 4% to about 35% by weight or from about 4% to about 25% by weight of the composition, or from about 30% to about 65% by weight, or any weight percent within a range defined by the following beginning and end points, selected from the following list: 0.5, 1, 2, 3, 4, 5, 6, 7, 10, 15, 17, 20, 23, 26, 30, 34, 37, 40, 45, 50, 55, 60, 65 and 70.

Note, these weight percents and all of the weight percents described herein, unless otherwise indicated, are based on a neat addition of the components to the composition, meaning that the solvent, such as, water is not counted in the weight percents of the components in water (solvent) added to the compositions of this invention; however, the amount of water added with the components is included in the total amount of water described in the compositions.

In some embodiments, the etching solution compositions disclosed herein are formulated to be substantially free of or free of at least one, more than one in any combination, or all of the following chemical compounds: hydrogen peroxide and other peroxides or peroxides other than hydrogen peroxide; organic oxidizers; inorganic oxidizers such as, for example, nitric acid, perchloric acid, and sulfuric acid; metal containing oxidizers, such as $Fe^{3+}$ and $Ce^{4+}$; fluorides; fluorine-containing compounds other than HF; phosphorus-containing compounds and abrasive materials.

Solvents (Optional)

The etching solution compositions of the present invention optionally include one or more water-miscible organic solvents. Examples of water-miscible organic solvents that can be used are ethylene glycol, propylene glycol, 1,4-butanediol, tripropylene glycol methyl ether, propylene glycol propyl ether, diethylene gycol n-butyl ether (e.g. commercially available under the trade designation Dowanol DB), glycol ether (commercially available as Dowanol DPM), hexyloxypropylamine, propylene glycol methyl ether acetate (PGMEA), poly(oxyethylene)diamine, dimethyl acetamide, N-methylpyrrolidone, triethylphosphate, sulfolane, tetrahydrofurfuryl alcohol, glycerol, alcohols, sulfoxides, or mixtures thereof. Preferred solvents may be alcohols, glycol ethers, diols, sulfoxides, dimethyl acetamide, N-methylpyrrolidone, triethylphosphate, sulfolane or mixtures thereof.

In other embodiments, the etching solution compositions of the present invention optionally include one or more water-miscible organic solvents, such as, dimethylsulfoxide (DMSO) and/or triethyl phosphate. The one or more solvents may comprise amide solvents, such as dimethyl acetamide (DMAC), N-methylpyrrolidone (NMP), 1,3-dimethyl-3,4,5,6-tetrahydro-2(1H)-pyrimidinone, 2,3,4,5-tetrahydrothiophene-1,1-dioxide (Sulfolane), 1,3-dimethyl-2-imidazolidnone, and 1-butyl 2-pyrrolidinone, such as, TamiSolve®NxG dipolar aprotic solvent from Eastman Chemical Co. The one or more solvents may comprise acid solvents, such as, methanesulfonic acid, propionic acid, lactic acid, and acetic acid.

The one or more solvents may comprise ester solvents, such as, 2-(1-methoxy)propyl acetate, and propylene carbonate. The one or more solvents may comprise ketone solvents, such as, cyclopentanone and/or ether solvents, such as, 1,4-dioxane, dimethoxyethane, or poly(propylene glycol)monobutyl ether. Further, the compositions of this invention may comprise mixtures of the one or more types of solvents listed above and one or more individual solvents listed above in any combination.

The preferred solvents include sulfolane, DMSO, and methanesulfonic acid.

It is believed that, for most applications, the amount of the one or more water-miscible organic solvents, if present, will comprise from about 0.00001% to about 70%, or from about 0.01 to about 50%, or from about 1 to about 50% by weight, or from about 2 to about 40% by weight or from about 4% to about 30% by weight, or from about 4% to about 25%, or from about 4% to about 20% by weight, or from about 1% to about 10% by weight of the composition. In alternative embodiments, the amount of the one or more water-miscible organic solvents, if present, may comprise an amount within a range of weight percents defined by any of the following endpoints: 0.000001%, 0.01, 1, 2, 4, 9, 10, 15, 20, 25, 30, 34, 38, 40, 44, 50 and 70.

In still other embodiments, when water and organic solvent, are present, the total amount of water and organic solvent may be from about 10% to about 85% by weight, or from about 55% to about 99% by wt, or from about 35% to about 60% by wt, or from about 50% to about 95% by wt, or from about 60% to about 90% by wt of the composition, or in a weight percent in any range defined by any of the following endpoints: 1, 2, 5, 10, 20, 25, 30, 35, 40, 45, 50, 60, 65, 70, 80, 90, 95, 99. In some embodiments the amount of solvent will be greater than the amount of water, in others the amount of water will be greater than the amount of solvent. In some preferred embodiments the amounts of solvent is within ±50%, or within ±25%, or within ±22%, or within ±20% of the amount of water.

In some embodiments the compositions of this invention will be free of or substantially free of any (in any combination) or all of the above-listed water-miscible organic solvents in any combination or all water-miscible organic solvents added to the composition.

Fluorine-Containing-Etching Compounds (Optional)

The etching solution compositions of the present invention may comprise one or more fluorine-containing-etching compounds which may include HF, tetrafluoroboric acid, hexafluorosilicic acid, other compounds containing B—F or Si—F bonds, tetrabutylammonium tetrafluoroborate (TBA-BF4), $H_2ZrF_6$, $H_2TiF_6$, $HPF_6$, ammonium hexafluorosilicate, ammonium hexafluorotitanate, or quaternary ammonium fluorides. The quaternary ammonium fluorides include ammonium fluoride (NH4F), ammonium bifluoride (NH4HF2), and tetraalkylammonium fluorides, or mixtures thereof. The fluorine-containing-etching compounds may be added, in some embodiments of the etchant composition of the invention to increase the TiN etch rate.

The quaternary ammonium fluorides contemplated herein include compounds having the formula $NR^1R^2R^3R^4F$, wherein $R^1$, $R^2$, $R^3$ and $R^4$ may be the same as or different from one another and are selected from the group consisting of hydrogen, straight-chained or branched $C_1$-$C_6$ alkyl (e.g., methyl, ethyl, propyl, butyl, pentyl, and hexyl), and substituted or unsubstituted $C_6$-C10 aryl, e.g., benzyl.

Tetraalkylammonium fluorides that may be used and are commercially available include tetraethylammonium fluoride (TEAF), tetramethyammonium fluoride (TMAF), tetrapropylammonium fluoride (TPAF), tetrabutylammonium fluoride (TBAF), tributylmethylammonium fluoride (TB-MAF), benzyltrimethylammonium fluoride (BTMAF), and combinations thereof. Tetraalkylammonium fluorides which are not commercially available may be prepared in a manner analogous to the published synthetic methods used to prepare TMAF, TEAF, TPAF, TBAF, TBMAF, and BTMAF, which are known to one ordinary of skill in the art.

It is believed that the amount of the one or more fluorine-containing-etching compounds, if present, in the etching composition of the present invention may be from about 0.01% to about 20%, or about 0.05% to about 20%, or about 0.08% to about 16%, or about 0.01% to about 10% or about 0.01% to about 10% or about 0.05% to about 6%, or about 0.1% to about 20% or about 0.1% to about 15% or about 0.5% to about 10% or about 1% to about 6% by weight of the composition. In some embodiments, if one or more quaternary ammonium fluorides are present, the amount may be from about 0.01% to about 20%, or about 0.01% to about 15%, or about 0.02% to about 10%, or about 0.02% to about 8% or about 0.04% to about 5% by weight of the composition. The amount of the one or more fluorine-containing-etching compounds, if present, in the etching composition of the present invention may be any weight percent in a range defined by the following endpoints in any combination: 0.01, 0.02, 0.04, 0.05, 0.08, 0.1, 0.5, 1, 5, 6, 10, 12, 15, 16, 18 and 20.

In some embodiments the compositions of this invention will be free of or substantially free of any (in any combination) or all of the above-listed fluorine-containing-etching compounds or quaternary ammonium fluorides.

The compositions of the invention may be free of or substantially free of quaternary ammonium hydroxides, including tetraalkyl hydroxides, choline hydroxide or ammonium hydroxide added to the composition.

Ammonium Salts of an Organic Acid (Optional)

The etching solution compositions of the present invention may optionally further comprise an ammonium salt of an organic acid. By ammonium is meant a salt of any amine of the form $NH4^+$. Exemplary ammonium salts include triammonium citrate (TAC), ammonium acetate, ammonium lactate, diammonium citrate, diammonium succinate, and combinations thereof. Still other ammonium salts may include ammonium benzoate, ammonium propionate, ammonium formate, ammonium oxalate, ammonium tartarate, ammonium succinate, ammonium maleate, ammonium malonate, ammonium fumarate, ammonium malate, ammonium ascorbate, ammonium mandelate, and ammonium phthalate. In some embodiments, the ammonium salts comprise ammonium acetate, ammonium benzoate, triammonium citrate or a combination thereof.

The ammonium salt, if present, may function to increase the etch rate of the TiN and/or the etch rate of W and/or in some embodiments to increase the TiN/W selectivity.

In some embodiments the compositions of this invention will be free of or substantially free of any (in any combination) or all of the above-listed ammonium salts of an organic acid added to the composition.

It is believed that the amount of the ammonium salt of an organic acid, if present, in the etching composition of the present invention will be from about 0% to 70% by weight, or from about 0% to 20% by weight, or from about 0.01 to about 70% by weight, or 0.1% to about 20% by weight of the composition. Preferably the ammonium salt of an organic acid, if present, comprises from about 0.5% to about 15% by weight, or about 1% to about 15% or from about 2% to about 10% by weight of the composition. In alternative embodiments, the amount of the one or more ammonium salts of an organic acid, if present, will comprise a weight percent in a range defined by the following endpoints in any combination: 0.01, 0.1, 0.5, 1, 2, 10, 15, 20, 30, 40, 50, 60 and 70.

Metal Chelating Agent (Optional)

Another optional ingredient that can be added in the cleaning composition is one or more metal chelating agents which typically function to increase the capacity of the composition to retain metals in solution and to enhance the dissolution of metallic residues. Typical examples of chelating agents useful for this purpose are the following organic acids and their isomers and salts: (ethylenedinitrilo)tetraacetic acid (EDTA), butylenediaminetetraacetic acid, (1,2-cyclohexylenedinitrilo-)tetraacetic acid (CyDTA), diethylenetriaminepentaacetic acid (DETPA), ethylenediaminetetrapropionic acid, (hydroxyethyl)ethylenediaminetriacetic acid (HEDTA), N,N,N',N'-ethylenediaminetetra (methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrolotriacetic acid (NTA), citric acid, tannic acid, tartaric acid, gluconic acid, saccharic acid, glyceric acid, oxalic acid, phthalic acid, maleic acid, mandelic acid, malonic acid, salicylic acid, propyl gallate, pyrogallol, 8-hydroxyquinoline, and cysteine. Preferred chelating agents are aminocarboxylic acids such as EDTA, CyDTA and aminophosphonic acids such as EDTMP and in alternative embodiments, the preferred chelating agent is tannic acid.

It is believed that, for most applications, if present, the one or more chelating agents will be present in the composition in an amount of from 0.00001 to about 10% by weight, preferably in an amount of from about 0.1 wt. % to about 10 wt. %, or about 0.1 to 7% by weight, or in amount of from about 0.1 wt. % to about 7 wt. % of the composition. The amount of the one or more chelating agents, if present, may comprise a weight percent in a range defined by the following endpoints in any combination: 0.01, 0.1, 0.5, 1, 2, 4, 5, 7, 10.

In some embodiments the compositions of this invention will be free of or substantially free of any (in any combination) or all of the above-listed metal chelating agents added to the composition.

Corrosion Inhibitor (Optional)

The compositions of the present invention optionally comprise one or more corrosion inhibitors. Corrosion inhibitors serve to react with the substrate surface being cleaned, which may be a metal or a nonmetal, to passivate the surface and prevent excessive etching during cleaning. In some embodiments, it can be added to adjust the tungsten etch rate.

Any corrosion inhibitor known in the art for similar applications may be used. Examples of corrosion-inhibitors include aromatic hydroxyl compounds, phenolic derivatives with at least the two hydroxyl groups, acetylenic alcohols, carboxyl group-containing organic compounds and anhydrides thereof, and triazole compounds. In some embodiments, mixtures of at least two of these compounds are employed in the etching solution compositions.

Examples of phenolic derivatives with at least the two hydroxyl groups include gallic acid, catechol, t-butyl catechol, p-benzenediol, m-benzenediol, o-benzenediol, 1,2,3-benzenetriol, 1,2,4-benzenetriol, and 1,3,5-benzenetriol. In some embodiments, gallic acid is the preferred phenolic derivative.

Exemplary aromatic hydroxyl compounds include phenol, cresol, xylenol, salicyl alcohol, p-hydroxybenzyl alcohol, o-hydroxybenzyl alcohol, p-hydroxyphenethyl alcohol, p-aminophenol, m-aminophenol, diaminophenol, p-hydroxybenzoic acid, o-hydroxybenzoic acid, 2,4-dihydroxybenzoic acid, 2-5-dihydroxybenzoic acid, 3,4-dihydroxybenzoic acid and 3,5-dihydroxybenzoic acid.

Exemplary acetylenic alcohols include 2-butyne-1,4-diol, 3,5-dimethyl-1-hexyn-3-ol, 2-methyl-3-butyn-2-ol, 3-methyl-1-pentyn-3-ol, 3,6-dimethyl-4-octyn-3,6-diol, 2,4-7,9-tetramethyl-5-decyne-4,7-diol and 2,5-dimethyl-3-hexyne 2,5-diol.

Exemplary carboxyl group-containing organic compounds and anhydrides thereof include formic acid, butyric acid, isobutyric acid, oxalic acid, malonic acid, succinic acid, glutaric acid, maleic acid, fumaric acid, benzoic acid, phthalic acid, 1,2,3-benzenetricarboxylic acid, glycolic acid, maleic acid, acetic anhydride and salicylic acid.

Exemplary triazole compounds include benzotriazole, o-tolyltriazole, m-tolyltriazole, p-tolyltriazole, carboxybenzotriazole, 1-hydroxybenzotriazole, nitrobenzotriazole and dihydroxypropylbenzotriazole.

In an exemplary embodiment, the corrosion inhibitors include one or more of benzotriazole, carboxybenzotriazole, amino-benzotriazole, D-fructose, L-ascorbic acid, vanillin, salicylic acid, diethyl hydroxylamine, and poly(ethyleneimine).

In other embodiments, the corrosion inhibitor is a triazole and is at least one of benzotriazole, o-tolyltriazole, m-tolyltriazole, and p-tolyltriazole.

In still other embodiments, the one or more corrosion inhibitors in the compositions of this invention comprise amines and include N,N,N,N,N-pentamethyldiethylenetriamine, N,N-dimethyl-p-phenylenediamine, poly(ethylenimine), ethylenediamine, (, 1-octylamine, 4-isopropylaniline, diethylenetriamine, and mixtures thereof. Other amines useful as corrosion inhibitors in the compositions of this invention include 5 or 6 membered heterocyclic amines, such as, pyrrolidines, pyridines, pyridoxines, morpholines and piperazines and mixtures thereof. The corrosion inhibitors may be morpholines and piperazines, such as 3-morpholinopropylamine (APM), 1-(2-aminoethyl)piperazine (AEP), 4-(2-hydroxyethyl)morpholine (HEM), (hydroxypropyl)morpholine, aminoethylmorpholine, aminopropylmorpholine, and mixtures thereof.

Still other organic amines that may be used as the one or more corrosion inhibitors in the etching compositions of this invention include species having the general formula $NR_1R_2R_3$, wherein $R_1$, $R_2$ and $R_3$ may be the same as or different from one another and are selected from the group consisting of hydrogen, straight-chained or branched C1-C6 alkyl (e.g., methyl, ethyl, propyl, butyl, pentyl, and hexyl), straight-chained or branched C1-C6 alcohol (e.g., methanol, ethanol, propanol, butanol, pentanol, and hexanol), and straight chained or branched ethers having the formula $R_4—O—R_5$, where $R_4$ and $R_5$ may be the same as or different from one another and are selected from the group consisting of C1-C6 alkyls as defined above. Most preferably, at least one of $R_1$, $R_2$ and $R_3$ is a straight-chained or branched C1-C6 alcohol. Examples include, without limitation, alkanolamines, such as primary, secondary and tertiary alkanolamines, some may have 1-5 carbons. Examples of alkanolamines that may be used in the compositions of this invention include aminoethylethanolamine, N-methylaminoethanol, 2-(2-aminoethoxy)ethanol (AEE), 2-(2-aminoethylamino)ethanol, dimethylaminoethoxyethanol, N-methyldiethanolamine, N-methylethanolamine (NMEA), monoethanolamine (MEA), triethanolamine, 1-amino-2-propanol, 3-amino-1-propanol, diisopropylamine, isopropylamine, triisopropanolamine, 2-amino-1-butanol, isobutanolamine, 1,2-bis(2-aminoethoxy)ethane, N-ethyl ethanolamine, N,N-dimethylethanolamine, N,N-diethyl ethanolamine, N-ethyl diethanolamine, cyclohexylaminediethanol and mixtures thereof. Other amines useful as corrosion inhibitors include triethylenediamine, ethylenediamine, hexamethylenediamine, diethylenetriamine, triethylamine, trimethylamine, and combinations thereof; diglycolamine; and combinations of amines and alkanolamines. When the amine includes the ether component, the amine may be considered an alkoxyamine, e.g., 1-methoxy-2-aminoethane. The organic amine may comprise monoethanolamine.

The corrosion inhibitors may be selected from N,N,N,N,N-pentamethyldiethylenetriamine, N,N-dimethyl-p-phenylenediamine, poly(ethylenimine), diethylenetriamine, morpholinopropylamine (APM) and 1-(2-aminoethyl)piperazine (AEP).

Another example of a corrosion inhibitor useful in the compositions of this invention are polyethyleneimines (PEI), such as those sold by BASF under the trademark LUPASOL®. Preferred polyethylenimines are branched, and have an average MW of about 800, such as BASF's LUPASOL® 800.

It is believed that for most applications, if present, the one or more corrosion-inhibitors will comprise from about 0.000001 wt. % to about 5 wt. %, or from about 0.00001 wt. % or 0.001 wt. % to about 15 wt. % of the composition; preferably comprise from about 0.001 wt. % to about 10 wt. %, or from about 0.5 wt. % to about 5 wt. %, or from about 0.1 wt. % to about 2 wt. % or about 0.5 wt. % to about 1 wt. % or about 0.001 wt. % to about 1 wt. % of the composition of the composition or any wt. % falling within a range defined by the following end points: 0.000001, 0.00001, 0.00005, 0.001, 0.1, 0.5, 1, 2, 5, 7, 10 and 15.

In some embodiments the compositions of this invention will be free of or substantially free of any or all of the above-listed corrosion inhibitors added to the composition including any or all of the aromatic hydroxyl compounds and/or any or all of the acetylenic alcohols and/or any or all of the carboxyl group-containing organic compounds and/or the anhydrides thereof, and/or any or all of the triazole compounds and/or akanolamines and/or any or all of the amines and/or any or all of the heterocyclic amines.

Other Optional Ingredients

The cleaning composition of the present invention may also include one or more of the following additives: one or more surfactants, one or more chemical modifiers, one or more dyes, one or more biocides, and other additives. The additive(s) may be added to the extent that they do not adversely affect the pH range of the composition. Examples of surfactants that may be added to the composition of this invention are hexadecyl trimethylammonium p-toulenesulfonate and fluorosurfactants, such as, fluoroalkyl ammonium chloride type surfactants, such as S-106A from Chemguard.

In some embodiments, the compositions of this invention will be free of or substantially free of any or all of the above-listed surfactants added to the composition.

The additives, if present, such as one or more surfactants, chemical modifiers, dyes, biocides etc. can be included in the cleaning composition in conventional amounts, for example, amounts up to a total of about 5 weight % of the composition. In some embodiments, the one or more surfactants may be present in the composition from about 0.00001 to about 5% by weight, or from about 0.001 to about 5% by weight of the composition, or from about 0.005 to about 3 wt % of the composition.

In other embodiments, the compositions will be substantially free of or free of any or all of: surfactants, chemical modifiers, dyes and/or biocides.

In some embodiments, the compositions of this invention may be free of or substantially free of at least one, or more than one in any combination, or all of the following, or free of any additional of the following if already present in the composition: fluorine-containing-etching compounds, metal-containing compounds, hydroxylamine or mixtures of hydroxylamine and derivative(s) including N,N-Diethyl hydroxylamine (DEHA), isopropylhydroxylamine, or salts of hydryoxylamine, such as hydroxylammonium chloride, hydroxylammonium sulfate. In other embodiments, the composition may be substantially free of (or free of) sodium and/or calcium. In some embodiments, the compositions disclosed herein are formulated to be substantially free of at least one of the following chemical compounds: alkyl thiols, and organic silanes. In other embodiments, the composition may be substantially free of or free of a halide-containing compound, for example it may be substantially free or free of one or more of the following: bromine-, chlorine- and/or iodine-containing compounds. In other embodiments, the composition may be substantially free of or free of organic and/or inorganic acids, and/or ammonium compounds, and/or ammonium salts of organic acids and/or hydroxyl-group containing solvents, and/or hydroxyl-group containing compounds, and/or quaternary ammonium compounds, and/or acetic acid.

pH

The pH of the etching compositions of this invention may be varied to produce a composition optimized for the intended end use. In one embodiment, the pH will be acidic, e.g., less than about 7, or less than about 6.5, or less than about 6, or from about 0.01 to about 7 or about 0.1 to about 6.5, or from about 1 to about 5, or from about 2.5 to about 5.5, or from about 1.5 to about 5, or from about 2 to about 6.5, or from about 0.01 to about 3.

The ratio of the weight percents of the components will cover all possible concentrated or diluted embodiments described herein and the point of use weight percent ratios. Towards that end, in one embodiment, a concentrated etching composition is provided that can be diluted for use as an etching solution. A concentrated composition, or "concentrate," advantageously permits a user, e.g., a process engineer, to dilute the concentrate to the desired strength at the point of use. Dilution of the concentrated cleaning composition may be in a range from about 1:1 to about 2500:1, preferably about 5:1 to about 200:1, wherein the cleaning composition is diluted at or just before the tool with deionized water or added organic solvent. It is to be appreciated by one skilled in the art that following dilution, except for the added water and/or solvent, the ratios of the weight percents of the components disclosed herein should remain unchanged. Further, it is understood that the one or more oxidizers may be added just prior to or at the point of use.

The etching solution composition of the present invention is typically prepared by mixing the components together in a vessel at room temperature until all solids have dissolved in the aqueous-based medium.

Method

In another aspect there is provided a method for etching both TiN and tungsten metal from a microelectronic device or portion of a microelectronic device comprising at least one of TiN-containing material and tungsten-containing metal and optionally also comprises a layer comprising aluminum oxide during the manufacture of the microelectronic device, the method comprising the steps of: contacting the microelectronic device with an etching solution for a time sufficient to at least partially remove the TiN-containing material and the tungsten containing metal from the device at a rate of from about 1 to about 500 Å/min or greater at room temperature or temperatures above room temperature, wherein the aqueous etching solution comprises, consists essentially of, or consists of: water; one or more oxidizers; and one or more of the following components or types of components: one or more fluorine-containing-etching compounds, one or more organic solvents, one or more chelating agents, one or more corrosion inhibitors, and one or more surfactants. The pH of the etching solution is 7 or less or the other ranges previously defined. In some embodiments, there may be at least one additional step including a rinsing step and a drying step.

The contacting step can be carried out by any suitable means such as, for example, immersion, spray, or via a batch or single wafer process.

The rinsing step is carried out by any suitable means, for example, rinsing the substrate with de-ionized water by immersion or spray techniques. In preferred embodiments, the rinsing step is carried out employing a mixture of de-ionized water and a water-miscible organic solvent such as, for example, isopropyl alcohol.

The drying step is carried out by any suitable means, for example, isopropyl alcohol (IPA) vapor drying or by centripetal force.

The etching solution of the invention having the composition described above provides uniform etching of W-containing metal or both W and TiN when both are present on the device. The etching solution of the invention provides low etching rate for metals the aluminum oxide and the selective etching property for TiN and tungsten-containing metals (the ratio of the etching rate for TiN and tungsten-containing metals with respect to the etching rate for AlOx and/or metals other than tungsten-containing metals and/or base materials (glass, silicon, silicon oxide, silicon nitride)) may be at least 10 or at least 15 or at least 20. The TiN and tungsten containing metals preferably have an etching ratio that is any of the ones previously described herein or from about 1:2 to 2:1, or from about 1:1.5 to 1.5:1, or from about 1:1.2 to 1.2:1 or from about 1:1.1 to 1.1 to 1 or from about 1:1.05 to 1.05 to 1. The TiN and tungsten based metals preferably have an etching rate that is from about 10 to 500 Å/min or more.

The etching solution of the invention may also contain components other than those mentioned above, such as moistening agents, coloring agents, foam inhibitors, in ranges that do not affect the etching property.

The method of forming each of the films of the TiN, tungsten-containing metals and AlOx layer on a substrate such as a microelectronic device is not particularly restricted, and any method such as CVD, sputtering or vapor deposition may be used, while the film-forming conditions also are not restricted.

The term "etch" or "etching" as used herein refers to a process utilizing the etching phenomenon, and it naturally includes patterning of TiN and tungsten-containing metals, as well as purposes of cleaning off of TiN and tungsten-containing metal residues. Thus, the microelectronic device may further include electronic devices of which production process has a step of dissolving off of the entirety of the TiN and tungsten-containing metals by an etching solution in the trenches that are part of the NAND memory device.

Treatment of a TiN and tungsten-containing metal with an etching solution according to the invention will usually be accomplished by a dipping method, but other methods such as spraying or spin etching may be used for the treatment. The conditions for treatment by dipping cannot be specified for all cases since they will differ depending on the components of the etching solution and the film thickness of the TiN, tungsten-containing metals and/or AlOx, but generally the treatment temperature will be from about 20-80° C. and more preferably from about 30-60° C. Such treatment may also be carried out while applying ultrasonic waves.

"At least partial removal" of the TiN and tungsten-containing metal (or excess metal) from the microelectronic device corresponds to at removal of at least 90% of the material, preferably at least 95% removal. Most preferably, at least 99% removal using the compositions of the present invention.

Following the achievement of the desired removal action, the etching solution of the present invention is readily removed from the device to which it has previously been applied, e.g., by rinse, wash, or other removal step(s), as may be desired and efficacious in a given end use application of the compositions of the present invention. For example, the device may be rinsed with a rinse solution including deionized water and/or dried (e.g., spin-dry, $N_2$, vapor-dry etc.). Thus, another aspect of the present invention relates to a two-step method of removing TiN and tungsten-containing metal from the surface of a microelectronic device. The first step involves the contacting of the TiN and tungsten-containing metal-containing device with the etching solutions of the present invention for a time of from about 1 minute to about 60 minutes, at temperature in a range of from about 25° C. to about 80° C., preferably less than 70° C., or from about 30° C. to about 60° C., or from about 25° C. to less than 60° C. and most preferably at about room temperature (about 25° C.). Thereafter, the device is contacted with a deionized water rinse at a temperature in a range from about 20° C. to about 25° C. for 15 seconds to about 5 minutes.

In one embodiment of the invention, the process temperature may be increased to increase the TiN-containing material etch rate and/or the W-containing metal etch rate. However, the higher the bath temperature, the shorter the bath life of the chemicals therein. In many cases if the bath temperature is 70° C. or higher, the chemicals in the bath will only be useful for one wafer or one batch of wafers. The higher temperatures will cause the vaporization of the more volatile components therein. It is therefore beneficial for increased bath life of the etching composition of this invention to practice the method at lower temperatures.

The features and advantages are more fully shown by the illustrative examples discussed below.

EXAMPLES

General Procedure for Preparing the Cleaning Compositions

All compositions which are the subject of the present Examples were prepared by mixing 100 g of material in a 250 mL beaker with a 1" Teflon-coated stir bar. For compositions without a water-miscible organic solvent, the first material added to the beaker was deionized (DI) water. H2O2 or other oxidizer was the last material added to the beaker. The remaining components can then be added in any order.

Compositions of the Substrate

Each substrate used in the present Examples comprised a tungsten film on a TEOS organosilicate glass (OSG) dielectric material on a silicon wafer. TiN films tested were applied directly on a silicon wafer. AlOx films were tested that had been applied on Si substrates.

Processing Conditions

Etching tests were run using 100 g of the cleaning compositions in a 250 ml beaker with a 1" long Teflon stir bar set at 500 rpm. The cleaning compositions were heated to the desired temperature indicated below on a hot plate if necessary. Wafer segments approximately 1"×1" in size were immersed in the compositions under the following set of conditions.

5 minutes @desired temp. (TiN, W and AlOx) is commonly used condition.

The segments were then rinsed for 3 minutes in a DI water overflow bath and subsequently dried using filtered nitrogen. The tungsten etch rates were estimated from changes in the thickness before and after etching and were measured by 4 point probe resistivity measurement. The TiN etch rates were also measured by a 4 point probe resistivity measurement. The AlOx etch rates could be measured by ellipsometer or 4 point probe resistivity measurement.

Etch Rate Measurement Procedure

Coupons of the wafers were measured for TiN, tungsten, and AlOx metal layer thickness by measuring the resistivity of the layer by employing a ResMap™ model 273 resistivity instrument from Creative Design Engineering, Inc. The AlOx could also be measured by ellipsometer. The coupons were then immersed in the composition at the desired temperature for 5 minutes. Then the coupons were rinsed with de-ionized water, dried, and the thickness of the metal layer was measured. A graph of the change in thickness as a function of immersion time was made and the etch rate in Angstroms/min was determined from the slope of the curve.

The following Tables and summaries highlight the features of the present invention.

TABLE 1

Examples of the Invention

| Raw Material | RM assay, wt % | Etchant 1 |
|---|---|---|
| DIW | | 6.00 |
| H₃PO₄ | 85 | 47.00 |
| HNO₃ | 60 | 30.00 |
| HF (M.W. = 20.01) | 5 | 7.00 |
| Sulfolane | | 10.00 |
| Total | | 100.00 |
| Temperature | | 25 |
| TiN E/R (A/min) | | 15.63 |
| W E/R (A/min) 20180313 | | 13.32 |
| AlOx E/R (A/min), 4P probe | | <1 |
| pH | | <1 |

TABLE 2

Examples of the Invention

| Formulation | RM assay, wt % | Etchant 2 | Etchant 3 |
|---|---|---|---|
| DIW | | 19.90 | 24.90 |
| HNO₃ | 60 | 75.00 | 75.00 |
| Sulfolane | | 5.00 | 0.00 |
| S-106A | | 0.10 | 0.10 |
| Total | | 100.00 | 100.00 |
| Temperature | | 60 | 60 |
| TiN E/R (A/min) | | 10.85 | 25.43 |
| W E/R (A/min) | | 9.93 | 22.95 |
| AlOx E/R (A/min) 4P probe | | <1 | <1 |
| pH | | <1 | <1 |

TABLE 3

Examples of the Invention

| Raw Material | RM assay, wt % | Etchant 4 |
|---|---|---|
| H2O2 | 30 | 40.00 |
| DIW | | 0.00 |
| H3PO4 | 85 | 39.81 |
| Sulfolane | | 20.00 |
| S-106A | | 0.19 |
| Total | | 100.00 |
| Temperature | | 40 |
| TiN E/R (A/min) | | 12.07 |
| W E/R (A/min) | | 14.87 |
| AlOx E/R (A/min) | | <1 |
| pH | | <1 |

TABLE 4

Examples of the Invention

| Formulation | RM assay, wt % | Etchant 5 | Etchant 6 |
|---|---|---|---|
| H2O2 | 30 | 40 | 40 |
| DIW | | 24.35 | 14.9 |
| LUPASOL ® 800 (1% in DIW) | | 0.14 | 0.09 |
| NH4F | 40 | 10 | |
| H3PO4 | 85 | 0.5 | 20 |
| DPM | | 20 | 20 |
| Tannic acid (1401-55-4) | | 5 | 5 |
| Hexadecyl trimethylammonium p-toulenesulfonate (138-32-9) | | 0.01 | 0.01 |
| Total | | 100 | 100 |
| Temperature | | 100 | |
| pH | | | |
| VM-TiN E/R (A/min) | | | |
| VM-W E/R (A/min) | | | |
| VM-AlOx E/R (A/min) | | | |

TABLE 5

Examples of the Invention

| Formulation | RM assay, wt % | Etchant 7 |
|---|---|---|
| H2O2 | 30 | 40 |
| DIW | | 14.98 |
| NH4F (40%) | 40 | 10 |
| H3PO4 (85%) | 85 | 10 |
| DPM | | 20 |
| Tannic acid (1401-55-4) | | 5 |
| Hexadecyl trimethylammonium p-toulenesulfonate (138-32-9) | | 0.02 |
| Total | | 100 |
| pH | | |
| Temperature | | 50 |
| TiN E/R (A/min) | | 56.17 |
| W E/R (A/min) | | 107.88 |
| AlOx E/R (A/min) | | −5.92 |

Tables 6-11

The components listed in Tables 6-11, in contrast to Tables 1-5 are listed, not in the amounts of aqueous solutions in which they were added, but by the neat amounts present in the compositions. In addition to the aqueous solutions defined above, the LUPASOL was added to the compositions in a 0.01% strength solution in the Examples below. The amount of water reported in Tables 6-11, therefore is the total water in the composition from all sources.

TABLE 6

Comparative Example

| Raw Material | PAN |
|---|---|
| Acetic acid | 13.60 |
| H3PO4 | 70.89 |
| HNO3 | 1.80 |
| DIW | 13.71 |
| Total | 100.00 |
| Temperature | 70 |
| VM-TiN E/R (A/min) | 6.71 |
| VM-W E/R (A/min) | 3.20 |
| pH | <1 |

TABLE 7

Examples of the Invention

| Raw Material | Etchant 6J | Etchant 6I | Etchant 6B |
|---|---|---|---|
| DIW | 44.49997 | 44.49995 | 44.4999 |
| LUPASOL 800 | 0.00003 | 0.00005 | 0.0001 |
| H3PO4 | 25.50 | 25.50 | 25.50 |
| HNO3 | 30.00 | 30.00 | 30.00 |
| Total | 100.00 | 100.00 | 100.00 |
| Temperature | 65 | 65 | 65 |
| VM-TiN E/R (A/min) | 5.27 | 5.00 | 5.32 |
| VM-W E/R (A/min) | 74.33 | 54.73 | 46.87 |
| pH | <1 | <1 | <1 |

TABLE 8

Examples of the Invention

| Raw Material | Etchant 8D | Etchant 8C | Etchant 1R |
|---|---|---|---|
| DIW | 85.24995 | 73.24995 | 61.24995 |
| LUPASOL 800 | 0.00005 | 0.00005 | 0.00005 |
| HF | 0.25 | 0.25 | 0.25 |
| H3PO4 | 8.5 | 8.5 | 8.5 |
| HNO3 | 6.00 | 18.00 | 30.00 |
| Total | 100.00 | 100.00 | 100.00 |
| Temperature | 60 | 60 | 60 |
| VM-TiN E/R (A/min) | −2.62 | 4.22 | 8.41 |
| VM-W E/R (A/min) | 0.19 | 77.47 | 74.60 |
| pH | <1 | <1 | <1 |

TABLE 9

Examples of the Invention

| Raw Material | Etchant 8L | Etchant 8M | Etchant 8K |
|---|---|---|---|
| DIW | 65.73495 | 61.48495 | 44.48495 |
| LUPASOL 800 | 0.00005 | 0.00005 | 0.00005 |
| HF | 0.015 | 0.015 | 0.015 |
| H3PO4 | 4.25 | 8.5 | 25.5 |
| HNO3 | 30.00 | 30.00 | 30.00 |
| Total | 100.00 | 100.00 | 100.00 |
| Temperature | 60 | 60 | 60 |
| VM-TiN E/R (A/min) | 2.47 | 5.45 | 7.45 |
| VM-W E/R (A/min) | 52.24 | 62.03 | 39.03 |
| pH | <1 | <1 | <1 |

TABLE 10

Examples of the Invention

| Raw Material | Etchant 8T | Etchant 8I |
|---|---|---|
| DIW | 35.98995 | 35.98495 |
| LUPASOL 800 | 0.00005 | 0.00005 |
| HF | 0.01 | 0.015 |
| H3PO4 | 34.00 | 34.00 |
| HNO3 | 30.00 | 30.00 |
| Total | 100.00 | 100.00 |
| Temperature | 60 | 60 |
| VM-TiN E/R (A/min) | 4.29 | 7.79 |
| VM-W E/R (A/min) | 19.24 | 19.95 |
| pH | <1 | <1 |

TABLE 11

Examples of the Invention

| Raw Material | Etchant 1L | Etchant 2B | Etchant 2C |
|---|---|---|---|
| DIW | 72.09995 | 49.59995 | 39.59995 |
| Sulfolane | 0.00 | 22.50 | 32.50 |
| LUPASOL 800 | 0.00005 | 0.00005 | 0.00005 |
| HF | 0.05 | 0.05 | 0.05 |
| H3PO4 | 0.85 | 0.85 | 0.85 |
| HNO3 | 27.00 | 27.00 | 27.00 |
| Total | 100.00 | 100.00 | 100.00 |
| Temperature | 40 | 40 | 40 |
| VM-TiN E/R (A/min) | 1.85 | 3.24 | 6.15 |
| VM-W E/R (A/min) | 24.18 | 11.94 | 7.75 |
| pH | <1 | <1 | <1 |

The foregoing description is intended primarily for purposes of illustration. Although the invention has been shown and described with respect to an exemplary embodiment thereof, it should be understood by those skilled in the art that the foregoing and various other changes, omissions, and additions in the form and detail thereof may be made therein without departing from the spirit and scope of the invention.

The invention claimed is:

1. A tungsten and titanium nitride etching solution which comprises:
   water;
   two or more oxidizers comprising neat phosphoric acid and neat nitric acid, wherein a combined amount of the two or more oxidizers is 20 to 70% by weight of the etching solution;
   0.01 to 20% by weight of the etching solution of one or more fluorine-containing-etching compounds selected from HF, tetrafluoroboric acid, hexafluorosilicic acid, $HPF_6$, ammonium hexafluorosilicate, and mixtures thereof,
   10 to 35% by weight of the etching solution of sulfolane as an organic solvent and
   one or more of components selected from:
   0.00001 to 70% by weight of the etching solution of one or more additional organic solvents selected from alcohols, glycol ethers, diols, glycerol, sulfoxides, amides, acids, esters, ketones, ethers, and mixtures thereof,
0.00001 to 10% by weight of the etching solution of one or more chelating agents,
0.000001 to 5% by weight of the etching solution of one or more corrosion inhibitors selected from aromatic hydroxyl compounds, phenolic derivatives with at least two hydroxyl groups, acetylenic alcohols, carboxyl group-containing organic compounds and anhydrides thereof, triazole compounds, D-fructose, L-ascorbic acid, vanillin, salicylic acid, diethyl hydroxylamine, amines, alkanolamines, heterocyclic amines, polyethyleneimines, morpholines, piperazines, and mixtures thereof, and
up to 5% by weight of the etching solution of one or more surfactants,
wherein the etching solution is free of (i) metal-containing compounds, (ii) quaternary ammonium compounds and (iii) ammonium salts of an organic acid.

2. The etching solution of claim 1 comprising said one or more corrosion inhibitors.

3. The etching solution of claim 1, wherein said combined amount of the oxidizers is 20 to 50% by weight of the etching solution.

4. The etching solution of claim 3, further comprising said one or more corrosion inhibitors.

5. The etching solution of claim 1, wherein said one or more fluorine-containing-etching compounds comprises HF.

6. The etching solution of claim 1, wherein said one or more fluorine-containing-etching compounds consists of HF.

7. The etching solution of claim 1 comprising said one or more additional organic solvents.

8. The etching solution of claim 7, wherein said one or more additional organic solvents are selected from DMSO, pyridine, triethyl phosphate, DMAC, NMP, 1,3-Dimethyl-3,4,5,6-tetrahydro-2(1H)-pyrimidinone, 1,3-dimethyl-2-imidazolidnone, 1-butyl-2-pyrrolidinone, methanesulfonic acid, propionic acid, lactic acid, acetic acid, 2-(1-Methoxy) propyl acetate, propylene carbonate, cyclopentanone, 1,4-dioxane, dimethoxyethane, poly(propylene glycol) monobutyl ether and mixtures thereof.

9. The etching solution of claim 7, further comprising said one or more corrosion inhibitors.

10. The etching solution of claim 1 further comprising said one or more additional organic solvents, wherein said one or more additional organic solvents are selected from DMSO, pyridine, triethyl phosphate, DMAC, NMP, 1,3-Dimethyl-3,4,5,6-tetrahydro-2(1H)-pyrimidinone, 1,3-dimethyl-2-imidazolidnone, 1-butyl-2-pyrrolidinone, methanesulfonic acid, propionic acid, lactic acid, acetic acid, 2-(1-Methoxy)propyl acetate, propylene carbonate, cyclopentanone, 1,4-dioxane, dimethoxyethane, poly(propylene glycol)monobutyl ether and mixtures thereof.

11. The etching solution of claim 1 comprising one or more surfactants.

12. The etching solution of claim 11, wherein said one or more surfactants are selected are selected from hexadecyl trimethylammonium p-toulenesulfonate, fluorosurfactants and mixtures thereof.

13. The etching solution of claim 1 comprising one or more chelating agents.

14. The etching solution of claim 13, wherein said one or more chelating agents are selected from (ethylenedinitrilo) tetraacetic acid (EDTA), butylenediaminetetraacetic acid, (1,2-cyclohexylenedinitrilo-)tetraacetic acid (CyDTA), diethylenetriaminepentaacetic acid (DETPA), ethylenediaminetetrapropionic acid, (hydroxyethyl)ethylenediaminetriacetic acid (HEDTA), N, N,N',N'-ethylenediaminetetra (methylenephosphonic) acid (EDTMP), triethylenetetraminehexaacetic acid (TTHA), 1,3-diamino-2-hydroxypropane-N,N,N',N'-tetraacetic acid (DHPTA), methyliminodiacetic acid, propylenediaminetetraacetic acid, nitrolotriacetic acid (NTA), citric acid, tannic acid, tartaric acid, gluconic acid, saccharic acid, glyceric acid, oxalic acid, phthalic acid, maleic acid, mandelic acid, malonic acid, salicylic acid, propyl gallate, pyrogallol, 8-hydroxyquinoline, cysteine, and mixtures thereof.

15. The etching solution of claim 1 having a pH of less than about 1.

16. The etching solution of claim 1, wherein the composition is free of the one or more chelating agents.

17. A method for etching both TiN-containing material and tungsten-containing metal from a microelectronic device comprising at least one of TiN-containing material and tungsten-containing material during the manufacture of the microelectronic device, the method comprising the steps of:
contacting the microelectronic device with the etching solution of claim 1 for a time sufficient to at least partially remove the TiN-containing material and the tungsten-containing metal from the device.

18. The method of claim 17 wherein said aqueous etching solution comprises said one or more corrosion inhibitors.

19. The method of claim 17 wherein said aqueous etching solution comprises said one or more surfactants.

20. The method of claim 17, wherein the etching solution has a TiN:W etching rate ratio of about 1:10 to about 10:1.

21. The method of claim 17, wherein the etching solution has a TiN:W etching rate ratio of about 1:5 to about 5:1.

22. The method of claim 17, wherein the etching solution has a TiN:W etching rate ratio of about 1:3 to about 3:1.

23. The method of claim 17, wherein the etching solution has a TiN:W etching rate ratio of about 1:2 to about 2:1.

* * * * *